(12) United States Patent
Song et al.

(10) Patent No.: US 11,989,454 B2
(45) Date of Patent: May 21, 2024

(54) SEMICONDUCTOR DEVICES AND METHODS FOR PERFORMING PROGRAMMING OPERATIONS

(71) Applicant: SK hynix Inc., Icheon-si (KR)

(72) Inventors: Choung Ki Song, Icheon-si (KR); Woo Yeong Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 44 days.

(21) Appl. No.: 17/696,638

(22) Filed: Mar. 16, 2022

(65) Prior Publication Data

US 2023/0133799 A1 May 4, 2023

(30) Foreign Application Priority Data

Nov. 2, 2021 (KR) .......................... 10-2021-0149248

(51) Int. Cl.
| | | |
|---|---|---|
| *G06F 3/06* | (2006.01) | |
| *G11C 7/10* | (2006.01) | |
| *G11C 7/22* | (2006.01) | |
| *G11C 8/18* | (2006.01) | |

(52) U.S. Cl.
CPC .......... *G06F 3/0659* (2013.01); *G06F 3/0604* (2013.01); *G06F 3/0679* (2013.01); *G11C 7/1087* (2013.01); *G11C 7/1093* (2013.01); *G11C 7/222* (2013.01); *G11C 8/18* (2013.01)

(58) Field of Classification Search
CPC .... G06F 3/0604; G06F 3/0659; G06F 3/0679; G11C 7/1018; G11C 7/1045; G11C 7/1087; G11C 7/109; G11C 7/1093; G11C 7/1096; G11C 7/22; G11C 7/222; G11C 8/06; G11C 8/18
See application file for complete search history.

(56) References Cited

U.S. PATENT DOCUMENTS

| | | | |
|---|---|---|---|
| 2001/0022744 A1* | 9/2001 | Noda | G11C 29/02 |
| | | | 365/189.05 |
| 2005/0144372 A1 | 6/2005 | Walker | |
| 2016/0224255 A1* | 8/2016 | Park | G06F 3/0679 |
| 2018/0268879 A1* | 9/2018 | Choi | G11C 29/028 |
| 2019/0238135 A1 | 8/2019 | Lin et al. | |
| 2020/0162066 A1* | 5/2020 | Gans | G11C 29/00 |
| 2020/0219546 A1* | 7/2020 | Lee | G11C 7/1084 |
| 2020/0302980 A1* | 9/2020 | Kwon | G11C 7/109 |
| 2021/0160177 A1 | 5/2021 | Gray | |
| 2021/0405927 A1* | 12/2021 | Oh | G06F 3/0604 |

FOREIGN PATENT DOCUMENTS

| | | |
|---|---|---|
| KR | 100480999 B1 | 4/2005 |
| KR | 1020170100416 A | 9/2017 |
| KR | 1020210003351 A | 1/2021 |

* cited by examiner

*Primary Examiner* — Aracelis Ruiz
(74) *Attorney, Agent, or Firm* — WILLIAM PARK & ASSOCIATES LTD.

(57) ABSTRACT

A semiconductor device includes a programming control signal generation circuit configured to generate a programming control signal and a programming termination signal based on programming data when a programming operation is performed, and a programming control circuit configured to program a command, an address, and an operation signal, based on the programming control signal to generate a programming command, a programming address, and a programming operation signal.

22 Claims, 17 Drawing Sheets

SEMICONDUCTOR DEVICES AND METHODS FOR PERFORMING PROGRAMMING OPERATIONS

CROSS-REFERENCE TO RELATED APPLICATIONS

The present application claims priority under 35 U.S.C. 119(a) to Korean Patent Application No. 10-2021-0149248, filed on Nov. 2, 2021, which is incorporated herein by reference in its entirety.

BACKGROUND

1. Technical Field

Various embodiments relate generally to a semiconductor device, and more particularly, to a semiconductor device and method for performing a programming operation.

2. Related Art

In general, a semiconductor device may perform various internal operations including a write operation and a read operation. The semiconductor device may receive data to store in a memory block when a write operation is performed and may output data stored in a memory block when a read operation is performed.

Meanwhile, when the specification of the semiconductor device is changed, the semiconductor device is in the process of revising internal circuits that perform the internal operations. The revision of the internal circuits is costly and time-consuming.

SUMMARY

In an embodiment, a semiconductor device may include a programming control signal generation circuit configured to generate a programming control signal and a programming termination signal based on programming data when a programming operation is performed; and a programming control circuit configured to program a command, an address, and an operation signal, based on the programming control signal to generate a programming command, a programming address, and a programming operation signal.

In an embodiment, a semiconductor device may include a programming control signal generation circuit configured to generate a programming control signal and a programming termination signal based on input data when a programming operation is performed; and a programming control circuit configured to program a command, an address, and an operation signal, based on the programming control signal to generate a programming command, a programming address, and a programming operation signal.

In an embodiment, a method of performing a programming operation may include performing a programming write operation of storing input data in a memory block as programming data when a programming operation is performed; and performing a programming read operation of generating a programming control signal and a programming termination signal, based on the programming data stored in the memory block and programming a command, an address, and an operation signal, based on the programming control signal to generate a programming command, a programming address, and a programming operation signal.

In an embodiment, a semiconductor device may include: a programming data storage circuit configured to store input data as programming data, based on a programming write command and output the stored programming data, based on a programming read command; a programming control signal generation circuit configured to generate a programming control signal and a programming termination signal from the programming data when a programming operation is performed; and a programming control circuit configured to program a command, an address, and an operation signal, based on the programming control signal to generate a programming command, a programming address, and a programming operation signal.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
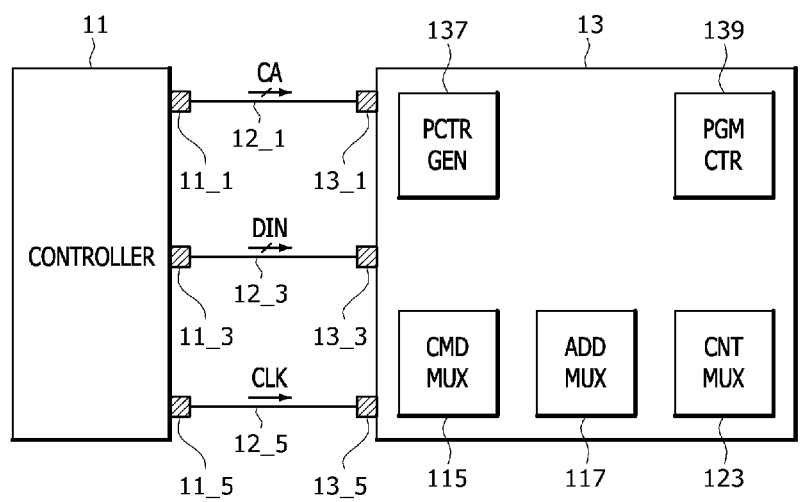
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 11 and a semiconductor device 13.

The controller 11 may include a first control pin 11_1, a second control pin 11_3, and a third control pin 11_5. The semiconductor device 13 may include a first device pin 13_1, a second device pin 13_3, and a third device pin 13_5. The controller 11 may transmit an external control signal CA to the semiconductor device 13 through a first transmission line 12_1 connected between the first control pin 11_1 and the first device pin 13_1. In the present embodiment, the external control signal CA may include a command and an address, but this is only an example, and the present disclosure is not limited thereto. Each of the first control pin 11_1, the first transmission line 12_1, and the first device pin 13_1 may be implemented in a plural number according to the number of bits of the external control signal CA. The controller 11 may transmit input data DIN to the semiconductor device 13 through a second transmission line 12_3 connected between the second control pin 11_3 and the second device pin 13_3. Each of the second control pin 11_3, the second transmission line 12_3, and the second device pin 13_3 may be implemented in a plural number according to the number of bits of the input data DIN. The controller 11 may transmit a clock CLK to the semiconductor device 13 through a third transmission line 12_5 connected between the third control pin 11_5 and the third device pin 13_5. In an embodiment, a clock CLK may be a clock signal.

Figure 2:
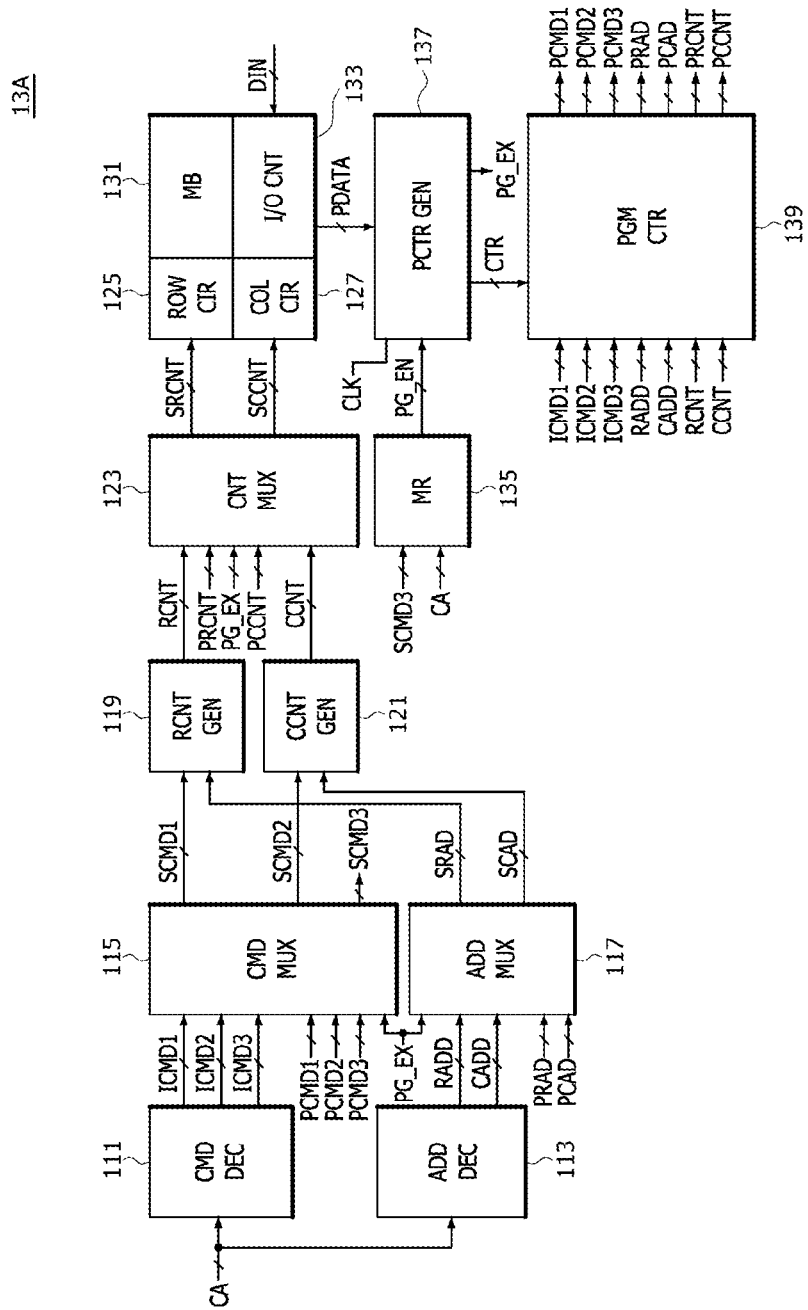
FIG. 2 is a block diagram illustrating a configuration of a semiconductor device according to an embodiment of the present disclosure.

The semiconductor device 13 may include a programming control signal generation circuit (PCTR GEN) 137 that generates a programming control signal (CTR of FIG. 2) and a programming termination signal (PG_EX of FIG. 2). The semiconductor device 13 may include a programming control circuit (PGM CTR) 139 that generates programming commands (PCMD1, PCMD2, and PCMD3 of FIG. 2), programming addresses (PRAD and PCAD of FIG. 2), and programming operation signals (PRCNT and PCCNT of FIG. 2), based on the programming control signal (CTR of FIG. 2). The semiconductor device 13 may include a command multiplexing circuit (CMD MUX) 115 that selects and outputs the programming commands (PCMD1, PCMD2, and PCMD3 of FIG. 2), based on the programming termination signal (PG_EX of FIG. 2). The semiconductor device 13 may include an address multiplexing circuit (ADD MUX) 117 that selects and outputs the programming addresses (PRAD and PCAD of FIG. 2), based on the programming termination signal (PG_EX of FIG. 2). The semiconductor device 13 may include an operation signal multiplexing circuit (CNT MUX) 123 that selects and outputs the programming operation signals (PRCNT and PCCNT of FIG. 2), based on the programming termination signal (PG_EX of FIG. 2).

FIG. 2 is a block diagram illustrating a configuration of a semiconductor device 13A according to an embodiment of the present disclosure. As illustrated in FIG. 2, the semiconductor device 13A may include a command decoder (CMD DEC) 111, an address decoder (ADD DEC) 113, a command multiplexing circuit (CMD MUX) 115, an address multiplexing circuit (ADD MUX) 117, a row operation signal generation circuit (RCNT GEN) 119, a column operation signal generation circuit (CCNT GEN) 121, an operation signal multiplexing circuit (CNT MUX) 123, a row operation circuit (ROW CIR) 125, a column operation circuit (COL CIR) 127, a memory block (MB) 131, an input/output control circuit (I/O CNT) 133, a mode register (MR) 135, a programming control signal generation circuit (PCTR GEN) 137, and a programming control circuit (PGM CTR) 139.

The command decoder 111 may decode an external control signal CA to generate a first command ICMD1, a second command ICMD2, and a third command ICMD3. The first command ICMD1 may be generated to perform a row operation. The row operation may include an active operation, a refresh operation, an active operation for programming (hereinafter, referred to as "programming active operation"), or the like. The second command ICMD2 may be generated to perform a column operation. The column operation may include a write operation, a read operation, a write operation for programming (hereinafter, referred to as "programming write operation"), a read operation for programming (hereinafter, referred to as "programming read operation"), or the like. The third command ICMD3 may be generated to perform a mode register write operation, a mode register read operation, or the like. The command decoder 111 may be connected to the command multiplexing circuit 115. The command decoder 111 may apply the first command ICMD1, the second command ICMD2, and the third command ICMD3 to the command multiplexing circuit 115.

The address decoder 113 may decode the external control signal CA to generate a row address RADD and a column address CADD. The row address RADD may be generated to select at least one of the word lines (not shown) to which cell arrays included in the memory block 131 are connected when a row operation is performed. The column address CADD may be generated to select at least one of the bit lines (not shown) to which cell arrays included in the memory block 131 are connected when a column operation is performed. The address decoder 113 may be connected to the address multiplexing circuit 117. The address decoder 113 may apply the row address RADD and the column address CADD to the address multiplexing circuit 117.

The command multiplexing circuit 115 may be connected to the command decoder 111, the programming control signal generation circuit 137, and the programming control circuit 139. The command multiplexing circuit 115 may receive the first command ICMD1, the second command ICMD2, and the third command ICMD3 from the command decoder 111. The command multiplexing circuit 115 may receive the programming termination signal PG_EX from the programming control signal generation circuit 137. The command multiplexing circuit 115 may receive a first programming command PCMD1, a second programming command PCMD2, and a third programming command PCMD3 from the programming control circuit 139. The command multiplexing circuit 115 may generate a first selection command SCMD1, a second selection command SCMD2, and a third selection command SCMD3 from the first command ICMD1, the second command ICMD2, the third command ICMD3, the first programming command PCMD1, the second programming command PCMD2, and the third programming command PCMD3, based on the programming termination signal PG_EX. The programming termination signal PG_EX may be activated when a programming operation is completed. When a programming operation is not completed and an inactivated programming termination signal PG_EX is received, the command multiplexing circuit 115 may output the first command ICMD1, the second command ICMD2, the third command ICMD3 as the first selection command SCMD1, the second selection command SCMD2, and the third selection command SCMD3, respectively. When a programming operation is completed and an activated programming termination signal PG_EX is received, the command multiplexing circuit 115 may output the first programming command PCMD1, the second programming command PCMD2, and the third programming command PCMD3 as the first selection command SCMD1, the second selection command SCMD2, and the third selection command SCMD3, respectively. The command multiplexing circuit 115 may be connected to the row operation signal generation circuit 119, the column operation signal generation circuit 121, and the mode register 135. The command multiplexing circuit 115 may apply the first selection command SCMD1 to the row operation signal generation circuit 119, may apply the second selection command SCMD2 to the column operation signal generation circuit 121, and may apply the third selection command SCMD3 to the mode register 135.

The address multiplexing circuit 117 may be connected to the address decoder 113, the programming control signal generation circuit 137, and the programming control circuit 139. The address multiplexing circuit 117 may receive the row address RADD and the column address CADD from the address decoder 113. The address multiplexing circuit 117 may receive the programming termination signal PG_EX from the programming control signal generation circuit 137. The address multiplexing circuit 117 may receive the programming row address PRAD and the programming column address PCAD from the programming control circuit 139. The address multiplexing circuit 117 may generate a selection row address SRAD and a selection column address SCAD from the row address RADD, the column address CADD, the programming row address PRAD, and the programming column address PCAD, based on the programming termination signal PG_EX. The selection row address SRAD and the selection column address SCAD, respectively, can be referred to as a selection address. When a programming operation is not completed and an inactivated programming termination signal PG_EX is received, the address multiplexing circuit 117 may output the row address RADD and the column address CADD as the selection row address SRAD and the selection column address SCAD, respectively. When a programming operation is completed and an activated programming termination signal PG_EX is received, the address multiplexing circuit 117 may output the programming row address PRAD and the programming column address PCAD as the selection row address SRAD and the selection column address SCAD, respectively. The address multiplexing circuit 117 may be connected to the row operation signal generation circuit 119 and the column operation signal generation circuit 121. The address multiplexing circuit 117 may apply the selection row address SRAD to the row operation signal generation circuit 119 and may apply the selection column address SCAD to the column operation signal generation circuit 121.

The row operation signal generation circuit 119 may be connected to the command multiplexing circuit 115 and the address multiplexing circuit 117. The row operation signal generation circuit 119 may receive the first selection command SCMD1 from the command multiplexing circuit 115. The row operation signal generation circuit 119 may receive the selection row address SRAD from the address multiplexing circuit 117. The row operation signal generation circuit 119 may generate a row operation signal RCNT, based on the first selection command SCMD1 and the selection row address SRAD. The row operation signal RCNT may include signals for controlling a row operation. In another embodiment, the row operation signal RCNT may include intermediate signals used to generate the signals for controlling the row operation. The row operation signal RCNT can be referred to as an operation signal.

The column operation signal generation circuit 121 may be connected to the command multiplexing circuit 115 and the address multiplexing circuit 117. The column operation signal generation circuit 121 may receive the second selection command SCMD2 from the command multiplexing circuit 115. The column operation signal generation circuit 121 may receive the selection column address SCAD from the address multiplexing circuit 117. The column operation signal generation circuit 121 may generate a column operation signal CCNT, based on the second selection command SCMD2 and the selection column address SCAD. The column operation signal CCNT may include signals (not shown) for controlling a column operation. In another embodiment, the column operation signal CCNT may include intermediate signals (not shown) used to generate the signals (not shown) for controlling the column operation. The column operation signal CCNT can be referred to as the operation signal.

The operation signal multiplexing circuit 123 may be connected to the row operation signal generation circuit 119, the column operation signal generation circuit 121, the programming control signal generation circuit 137, and the programming control circuit 139. The operation signal multiplexing circuit 123 may receive the row operation signal RCNT from the row operation signal generation circuit 119, and may receive the column operation signal CCNT from the column operation signal generation circuit 121. The operation signal multiplexing circuit 123 may receive the programming termination signal PG_EX from the programming control signal generation circuit 137. The operation signal multiplexing circuit 123 may receive the programming row operation signal PRCNT and the programming column operation signal PCCNT from the programming control circuit 139. The operation signal multiplexing circuit 123 may generate a selection row operation signal SRCNT and a selection column operation signal SCCNT from the row operation signal RCNT, the column operation signal CCNT, the programming row operation signal PRCNT, and the programming column operation signal PCCNT, based on the programming termination signal PG_EX. When a programming operation is not completed and an inactivated programming termination signal PG_EX is received, the operation signal multiplexing circuit 123 may output the row operation signal RCNT and the column operation signal CCNT as the selection row operation signal SRCNT and the selection column operation signal SCCNT, respectively. When a programming operation is completed and an activated programming termination signal PG_EX is received, the operation signal multiplexing circuit 123 may output the programming row operation signal PRCNT and the programming column operation signal PCCNT as the selection row operation signal SRCNT and the selection column operation signal SCCNT, respectively. The operation signal multiplexing circuit 123 may be connected to the row operation circuit 125 and the column operation circuit 127. The operation signal multiplexing circuit 123 may apply the selection row operation signal SRCNT to the row operation circuit 125, and may apply the selection column operation signal SCCNT to the column operation circuit 127. The selection row operation signal SRCNT and the selection column operation signal SCCNT, respectively, can be referred to as a selection operation signal.

The row operation circuit 125 may be connected to the operation signal multiplexing circuit 123 and the memory block 131. The row operation circuit 125 may receive the selection row operation signal SRCNT from the operation signal multiplexing circuit 123. The row operation circuit 125 may select a word line (not shown) to which a cell array (not shown) included in the memory block 131 on which a row operation is performed is connected, based on the selection row operation signal SRCNT. The row operation circuit 125 may select a word line (not shown) to which a cell array (not shown) included in the memory block 131 is connected, based on the selection row operation signal SRCNT when one of an active operation, a refresh operation, and a programming active operation is performed.

The column operation circuit 127 may be connected to the operation signal multiplexing circuit 123 and the input/output control circuit 133. The column operation circuit 127 may receive the selection column operation signal SCCNT from the operation signal multiplexing circuit 123. The column operation circuit 127 may control the input/output control circuit 133 so that a bit line (not shown) connected to a cell array (not shown) included in the memory block 131 on which a column operation is performed is selected, based on the selection column operation signal SCCNT. When a write operation is performed, the column operation circuit 127 may control the input/output control circuit 133 to store input data DIN in a cell array (not shown) included in the memory block 131, based on the selection column operation signal SCCNT. When a programming write operation is performed, the column operation circuit 127 may control the input/output control circuit 133 to store the input data DIN as programming data PDATA in a cell array (not shown) included in the memory block 131, based on the selection column operation signal SCCNT. When a read operation is performed, the column operation circuit 127 may control the input/output control circuit 133 to output the data stored in the cell array (not shown) included in the memory block 131, based on the selection column operation signal SCCNT. When a programming read operation is performed, the column operation circuit 127 may control the input/output control circuit 133 to output the programming data PDATA stored in the cell array (not shown) included in the memory block 131, based on the selection column operation signal SCCNT.

The input/output control circuit 133 may be connected to the column operation circuit 127 and the memory block 131. The input/output control circuit 133 may store the input data DIN to a cell array (not shown) included in the memory block 131 as the programming data PDATA, based on the control of the column operation circuit 127 when a programming write operation is performed. The input/output control circuit 133 may output the programming data PDATA stored in the cell array (not shown) included in the memory block 131, based on the control of the column operation circuit 127 when a programming read operation is performed. The input/output control circuit 133 may be connected to the programming control signal generation circuit 137. The input/output control circuit 133 may apply the programming data PDATA to the programming control signal generation circuit 137.

The mode register 135 may be connected to the command multiplexing circuit 115 and the programming control signal generation circuit 137. The mode register 135 may receive the third selection command SCMD3 from the command multiplexing circuit 115. The mode register 135 may extract and store a programming enable signal PG_EN from the external control signal CA, based on the third selection command SCMD3 when a mode register write operation is performed. The programming enable signal PG_EN may be activated for a programming operation. The mode register 135 may output the programming enable signal PG_EN, based on the third selection command SCMD3 when a mode register read operation is performed. The mode register 135 may apply the programming enable signal PG_EN to the programming control signal generation circuit 137.

The programming control signal generation circuit 137 may be connected to the input/output control circuit 133 and the mode register 135. The programming control signal generation circuit 137 may receive the programming data PDATA from the input/output control circuit 133, and may receive the programming enable signal PG_EN from the mode register 135. When a programming operation is performed and an activated programming enable signal PG_EN is received, the programming control signal generation circuit 137 may generate the programming control signal CTR and the programming termination signal PG_EX, based on the clock CLK and the programming data PDATA. The programming termination signal PG_EX may be activated when an operation in which the programming control signal CTR is generated from the programming data PDATA is terminated. In this embodiment, the clock CLK is applied from the controller (11 of FIG. 1), but the clock CLK may be generated inside the semiconductor device 13A according to an embodiment. The programming control signal generation circuit 137 may apply the programming control signal CTR to the programming control circuit 139.

The programming control circuit 139 may be connected to the command decoder 111, the address decoder 113, the row operation signal generation circuit 119, the column operation signal generation circuit 121, and the programming control signal generation circuit 137. The programming control circuit 139 may receive the first command ICMD1, the second command ICMD2, and the third command ICMD3 from the command decoder 111. The programming control circuit 139 may receive the row address RADD and the column address CADD from the address decoder 113. The programming control circuit 139 may receive the row operation signal RCNT from the row operation signal generation circuit 119. The programming control circuit 139 may receive the column operation signal CCNT from the column operation signal generation circuit 121. The programming control circuit 139 may receive the programming control signal CTR from the programming control signal generation circuit 137. When a programming operation is performed, the programming control circuit 139 may generate the first programming command PCMD1, the second programming command PCMD2, the third programming command PCMD3, the programming row address PRAD, the programming column address PCAD, the programming row operation signal PRCNT, and the programming column operation signal PCCNT from the first command ICMD1, the second command ICMD2, the third command ICMD3, the row address RADD, the column address CADD, the row operation signal RCNT, and the column operation signal CCNT, based on the programming control signal CTR. The programming control circuit 139 may be connected to the command multiplexing circuit 115, the address multiplexing circuit 117, and the operation signal multiplexing circuit 123. The programming control circuit 139 may apply the first programming command PCMD1, the second programming command PCMD2, and the third programming command PCMD3 to the command multiplexing circuit 115. The programming control circuit 139 may apply the programming row address PRAD and the programming column address PCAD to the address multiplexing circuit 117. The programming control circuit 139 may apply the programming row operation signal PRCNT and the programming column operation signal PCCNT to the operation signal multiplexing circuit 123.

Figure 3:
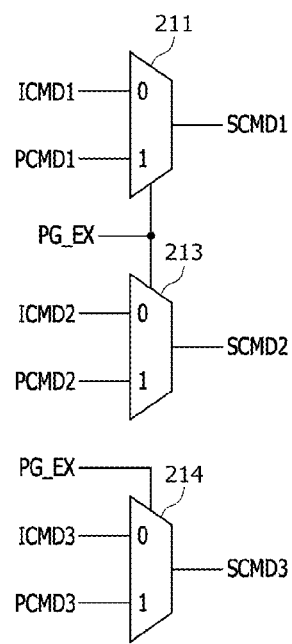
FIG. 3 is a circuit diagram illustrating a command multiplexing circuit according to an embodiment of the present disclosure.

FIG. 3 is a circuit diagram illustrating a command multiplexing circuit 115A according to an embodiment of the present disclosure. As illustrated in FIG. 3, the command multiplexing circuit 115A may include a first command multiplexer 211, a second command multiplexer 213, and a third command multiplexer 214.

The first command multiplexer 211 may generate a first selection command SCMD1 from a first command ICMD1 and a first programming command PCMD1, based on a programming termination signal PG_EX. When the programming is not completed and a deactivated programming termination signal PG_EX is received, the first command multiplexer 211 may select and output the first command ICMD1 as the first selection command SCMD1. When a programming is completed and an activated programming termination signal PG_EX is received, the first command multiplexer 211 may select and output the first programming command PCMD1 as the first selection command SCMD1.

The second command multiplexer 213 may generate a second selection command SCMD2 from a second command ICMD2 and a second programming command PCMD2, based on the programming termination signal PG_EX. When a programming is not completed and a deactivated programming termination signal PG_EX is received, the second command multiplexer 213 may select and output the second command ICMD2 as the second selection command SCMD2. When a programming is completed and an activated programming termination signal PG_EX is received, the second command multiplexer 213 may select and output the second programming command PCMD2 as the second selection command SCMD2.

The third command multiplexer 214 may generate a third selection command SCMD3 from a third command ICMD3 and a third programming command PCMD3, based on the programming termination signal PG_EX. When a programming is not completed and a deactivated programming termination signal PG_EX is received, the third command multiplexer 214 may select and output the third command ICMD3 as the third selection command SCMD3. When a programming is completed and an activated programming termination signal PG_EX is received, the third command multiplexer 214 may select and output the third programming command PCMD3 as the third selection command SCMD3.

Figure 4:
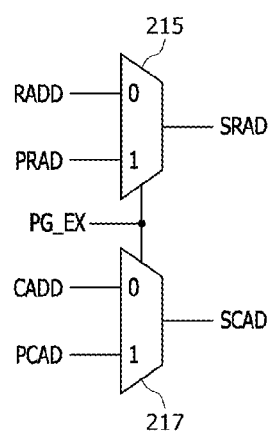
FIG. 4 is a circuit diagram illustrating an address multiplexing circuit according to an embodiment of the present disclosure.

FIG. 4 is a circuit diagram illustrating an address multiplexing circuit 117A according to an embodiment of the present disclosure. As illustrated in FIG. 4, the address multiplexing circuit 117A may include a first address multiplexer 215 and a second address multiplexer 217.

The first address multiplexer 215 may generate a selection row address SRAD from a row address RADD and a programming row address PRAD, based on the programming termination signal PG_EX. When a programming is not completed and a deactivated programming termination signal PG_EX is received, the first address multiplexer 215 may select and output the row address RADD as the selection row address SRAD. When a programming is completed and an activated programming termination signal PG_EX is received, the first address multiplexer 215 may select and output the programming row address PRAD as the selection row address SRAD.

The second address multiplexer 217 may generate a selection column address SCAD from a column address CADD and a programming column address PCAD, based on the programming termination signal PG_EX. When a programming is not completed and a deactivated programming termination signal PG_EX is received, the second address multiplexer 217 may select and output the column address CADD as the selection column address SCAD. When a programming is completed and an activated programming termination signal PG_EX is received, the second address multiplexer 217 may select and output the programming column address PCAD as the selection column address SCAD.

Figure 5:
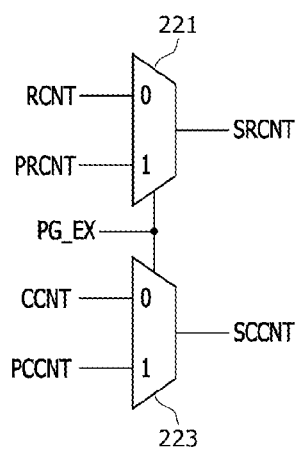
FIG. 5 is a circuit diagram illustrating an operation signal multiplexing circuit according to an embodiment of the present disclosure.

FIG. 5 is a circuit diagram illustrating an operation signal multiplexing circuit 123A according to an embodiment of the present disclosure. As illustrated in FIG. 5, the operation signal multiplexing circuit 123A may include a first operation signal multiplexer 221 and a second operation signal multiplexer 223.

The first operation signal multiplexer 221 may generate a selection row operation signal SRCNT from a row operation signal RCNT and a programming row operation signal PRCNT, based on a programming termination signal PG_EX. When a programming is not completed and a deactivated programming termination signal PG_EX is received, the first operation signal multiplexer 221 may select and output the row operation signal RCNT as the selection row operation signal SRCNT. When a programming is completed and an activated programming termination signal PG_EX is received, the first operation signal multiplexer 221 may select and output the programming row operation signal PRCNT as the selection row operation signal SRCNT.

The second operation signal multiplexer 223 may generate a selection column operation signal SCCNT from a column operation signal CCNT and a programming column operation signal PCCNT, based on the programming termination signal PG_EX. When a programming is not completed and a deactivated programming termination signal PG_EX is received, the second operation signal multiplexer 223 may select and output the column operation signal CCNT as the selection column operation signal SCCNT. When a programming is completed and an activated programming termination signal PG_EX is received, the second operation signal multiplexer 223 may select and output the programming column operation signal PCCNT as the selection column operation signal SCCNT.

Figure 6:
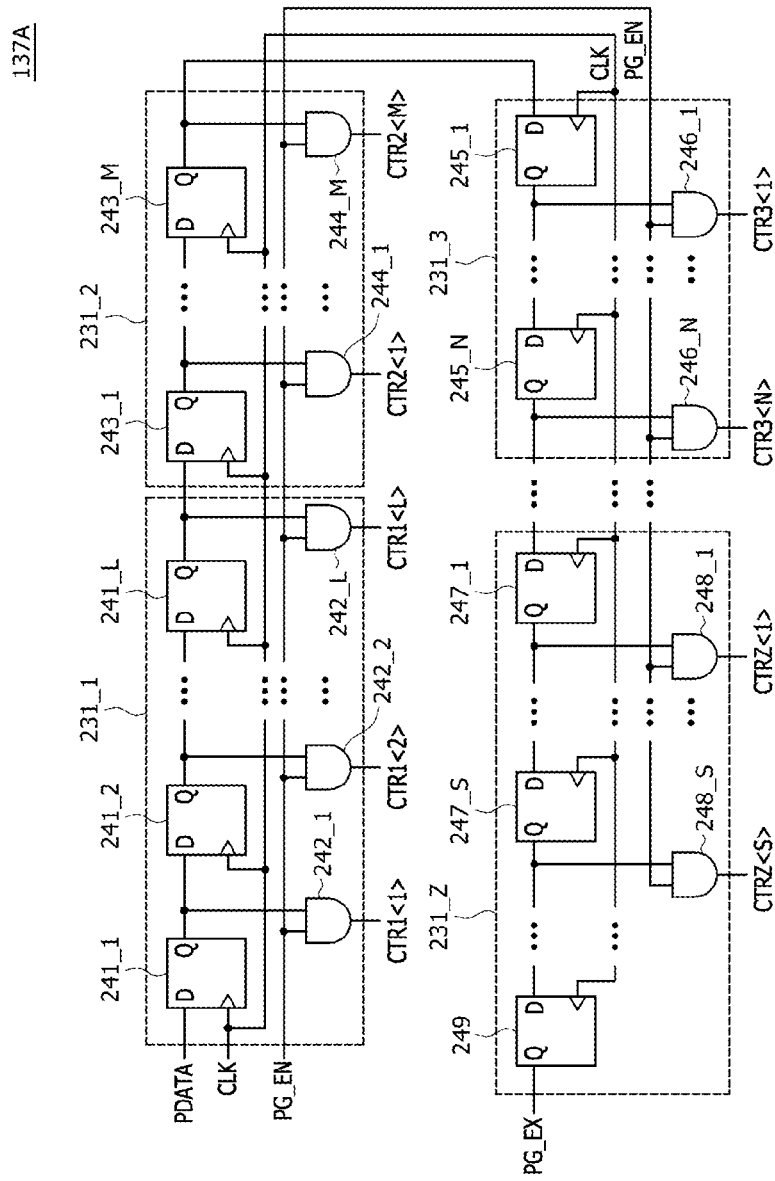
FIG. 6 is a circuit diagram illustrating a programming control signal generation circuit according to an embodiment of the present disclosure.

FIG. 6 is a circuit diagram illustrating a programming control signal generation circuit 137A according to an embodiment of the present disclosure. As illustrated in FIG. 6, the programming control signal generation circuit 137A may include first to $Z^{th}$ programming control signal generation circuits 231_1, 231_2, 231_3, . . . , and 231_Z.

The first programming control signal generation circuit 231_1 may include flip-flops 241_1, 241_2~241_L and AND gates 242_1, 242_2~242_L. As used herein, the tilde "~" indicates a range of components. For example, "241_1~241_L" indicates flip-flops 241_1, 241_2, . . . , and 241_L shown in FIG. 6. The flip-flop 241_1 may latch and output programming data PDATA in synchronization with a clock CLK. The AND gate 242_1 may receive a programming enable signal PG_EN and an output signal of the flip-flop 241_1 and perform a logical AND operation to generate a first bit CTR1<1> of a first programming control signal CTR1. The flip-flop 241_2 may latch and output the output signal of the flip-flop 241_1 in synchronization with the clock CLK. The AND gate 242_2 may receive the programming enable signal PG_EN and an output signal of the flip-flop 241_2 and perform a logical AND operation to generate a second bit CTR1<2> of the first programming control signal CTR1. The flip-flop 241_L may latch and output an output signal of the flip-flop 241_(L−1) (not shown) in synchronization with the clock CLK. The AND gate 242_L may receive the programming enable signal PG_EN and an output signal of the flip-flop 241_L and perform a logical AND operation to generate a $L^{th}$ bit CTR1<L> of the first programming control signal CTR1.

The second programming control signal generation circuit 231_2 may include flip-flops 243_1~243_M and AND gates 244_1~244_M. The flip-flop 243_1 may latch and output the output signal of the flip-flop 241_L in synchronization with the clock CLK. The AND gate 244_1 may receive the programming enable signal PG_EN and an output signal of the flip-flop 243_1 and perform a logical AND operation to generate a first bit CTR2<1> of a second programming control signal CTR2. The flip-flop 243_M may latch and output an output signal of the flip-flop 243_(M−1) (not shown) in synchronization with the clock CLK. The AND gate 244_M may receive the programming enable signal PG_EN and an output signal of the flip-flop 243_M and perform a logical AND operation to generate an $M^{th}$ bit CTR2<M> of the second programming control signal CTR2.

The third programming control signal generation circuit 231_3 may include flip-flops 245_1~245_N and AND gates 246_1, 246_2~246_N. The flip-flop 245_1 may latch and output the output signal of the flip-flop 243_M in synchronization with the clock CLK. The AND gate 246_1 may receive the programming enable signal PG_EN and an output signal of the flip-flop 245_1 and perform a logical AND operation to generate a first bit CTR3<1> of a third programming control signal CTR3. The flip-flop 245_N may latch and output an output signal of the flip-flop 245_(N−1) (not shown) in synchronization with the clock CLK. The AND gate 246_N may receive the programming enable signal PG_EN and an output signal of the flip-flop 245_N and perform a logical AND operation to generate an $N^{th}$ bit CTR3<N> of the third programming control signal CTR3.

The $Z^{th}$ programming control signal generation circuit 231_Z may include flip-flops 247_1~247_S~249 and AND gates 248_1~248_S. The flip-flop 247_1 may latch and output an output signal of the last flip-flop (not shown) included in the Z−$1^{th}$ programming control signal generation circuit (not shown) in synchronization with the clock CLK. The AND gate 248_1 may receive the programming enable signal PG_EN and an output signal of the flip-flop 247_1 and perform a logical AND operation to generate a first bit CTRZ<1> of a $Z^{th}$ programming control signal CTRZ. The flip-flop 247_S may latch and output an output signal of the flip-flop 247_(S−1) (not shown) in synchronization with the clock CLK. The AND gate 248_S may receive the programming enable signal PG_EN and an output signal of the flip-flop 247_S and perform a logical AND operation to generate an $S^{th}$ bit CTRZ<S> of the $Z^{th}$ programming control signal CTRZ. The flip-flop 249 may latch the output signal (i.e., last bit) of the flip-flop 247_S in synchronization with the clock CLK to output a programming termination signal PG_EX.

The programming control signal generation circuit 137A configured as described above may sequentially latch the programming data PDATA in synchronization with the clock CLK to generate the first to $Z^{th}$ programming control signals CTR1~CTRZ and the programming termination signal PG_EX. The programming control signal generation circuit 137A may sequentially latch the programming data PDATA in synchronization with the clock CLK to generate the first programming control signal CTR1, and may sequentially transfer the programming data PDATA from the first programming control signal CTR1 to the $Z^{th}$ programming control signal CTRZ and the programming termination signal PG_EX in a method of transferring the first programming control signal CTR1 to the second programming control signal CTR2 and transferring the second programming control signal CTR2 to the third programming control signal CTR3. When the programming termination signal PG_EX is activated, each of the first to $Z^{th}$ programming control signals CTR1~CTRZ may be programmed in such a way that the programming data PDATA has been sequentially latched and transferred. The programming control signal generation circuit 137A may apply the programmed first to $Z^{th}$ programming control signals CTR1~CTRZ to the programming control circuit 139 when the programming termination signal PG_EX is activated.

Figure 7:
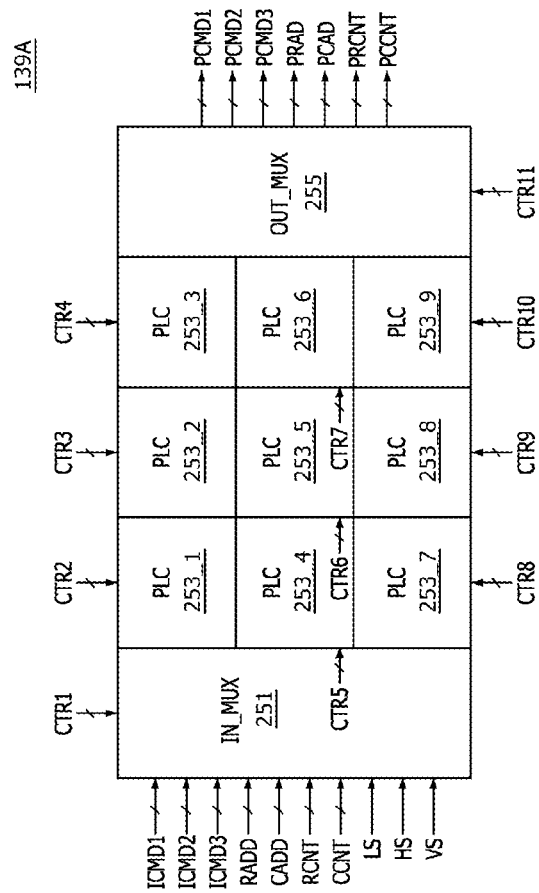
FIG. 7 is a block diagram illustrating a configuration of a programming control circuit according to an embodiment of the present disclosure.

FIG. 7 is a block diagram illustrating a configuration of a programming control circuit 139A according to an embodiment of the present disclosure. As illustrated in FIG. 7, the programming control circuit 139A may include an input multiplexing circuit (IN MUX) 251, first to ninth programming logic circuits (PLC) 253_1~253_9, and an output multiplexing circuit (OUT MUX) 255. In this embodiment, the programming control circuit 139A may receive first to eleventh programming control signals CTR1~CTR11 from a programming control signal generation circuit (137 of FIG. 2), but this is only an example and the present disclosure is not limited thereto.

The input multiplexing circuit 251 may receive a first command ICMD1, a second command ICMD2, a third command ICMD3, a row address RADD, a column address CADD, a row operation signal RCNT, a column operation signal CCNT, a first logic level signal LS, a second logic level signal HS, and a variable level signal VS. As an example, the first logic level signal LS may be a signal of a logic "low" level, and the second logic level signal HS may be a signal of a logic "high" level. The variable level signal VS may be implemented to have a predetermined level. The input multiplexing circuit 251 may select and receive at least one of the first command ICMD1, the second command ICMD2, the third command ICMD3, the row address RADD, the column address CADD, the row operation signal RCNT, the column operation signal CCNT, the first logic level signal LS, the second logic level signal HS, and the variable level signal VS, based on the first programming control signal CTR1.

The first programming logic circuit 253_1 may generate and store a lookup table signal (LUTS of FIG. 9), based on the second programming control signal CTR2. The lookup table signal (LUTS of FIG. 9) may include a plurality of bits, and the bits included in the lookup table signal (LUTS of FIG. 9) may be set to result values of various logic operations for at least one bit of a logic input signal (LIN of FIG. 9). The various logic operations for the logic input signal (LIN of FIG. 9) may include an inversion operation, a buffering operation, a logical AND operation, a logical OR operation, a logical NAND operation, a logical NOR operation, an exclusive logical AND operation, an exclusive logical OR operation, or the like. The first programming logic circuit 253_1 may receive the logic input signal (LIN of FIG. 9) from at least one of an output signal of the input multiplexing circuit 251 and an output signal of the fourth programming logic circuit 253_4. The first programming logic circuit 253_1 may generate a logic output signal (LOUT of FIG. 9) from the lookup table signal (LUTS of FIG. 9) stored therein, based on the logic input signal (LIN of FIG. 9). More specifically, the first programming logic circuit 253_1 may select and output one of the bits included in the lookup table signal (LUTS of FIG. 9) as the logic output signal (LOUT of FIG. 9) according to a logic bit set of the bits included in the logic input signal (LIN of FIG. 9). The first programming logic circuit 253_1 may output the logic output signal (LOUT of FIG. 9) to at least one of the second programming logic circuit 253_2 and the fourth programming logic circuit 253_4. A configuration in which the logic input signal (LIN in FIG. 9) is input to the first programming logic circuit 253_1 and a configuration in which the logic output signal (LOUT in FIG. 9) is output from the first programming logic circuit 253_1 may be variously implemented according to embodiments.

The second programming logic circuit 253_2 may generate and store a lookup table signal (not shown), based on the third programming control signal CTR3. The second programming logic circuit 253_2 may receive a logic input signal (not shown) from at least one of an output signal of the first programming logic circuit 253_1 and an output signal of the fifth programming logic circuit 253_5. The second programming logic circuit 253_2 may generate a logic output signal (not shown) from the lookup table signal (not shown) stored therein, based on the logic input signal (not shown). The second programming logic circuit 253_2 may output a logic output signal (not shown) to at least one of the third programming logic circuit 253_3 and the fifth programming logic circuit 253_5.

The third programming logic circuit 253_3 may generate and store a lookup table signal (not shown), based on the fourth programming control signal CTR4. The third programming logic circuit 253_3 may receive a logic input signal (not shown) from at least one of an output signal of the second programming logic circuit 253_2 and an output signal of the sixth programming logic circuit 253_6. The third programming logic circuit 253_3 may generate a logic output signal (not shown) from the lookup table signal (not shown) stored therein, based on the logic input signal (not shown). The third programming logic circuit 253_3 may output the logic output signal (not shown) to at least one of the sixth programming logic circuit 253_6 and the output multiplexing circuit 255.

The fourth programming logic circuit 253_4 may generate and store a lookup table signal (not shown), based on the fifth programming control signal CTR5. The fourth programming logic circuit 253_4 may receive a logic input signal (not shown) from at least one of the output signal of the input multiplexing circuit 251, the output signal of the first programming logic circuit 253_1, and an output signal of the seventh programming logic circuit 253_7. The fourth programming logic circuit 253_4 may generate a logic output signal (not shown) from the lookup table signal (not shown) stored therein, based on the logic input signal (not shown). The fourth programming logic circuit 253_4 may output the logic output signal (not shown) to at least one of the first programming logic circuit 253_1, the fifth programming logic circuit 253_5, and the seventh programming logic circuit 253_7.

The fifth programming logic circuit 253_5 may generate and store a lookup table signal (not shown), based on the sixth programming control signal CTR6. The fifth programming logic circuit 253_5 may receive a logic input signal (not shown) from at least one of the output signal of the second programming logic circuit 253_2, the output signal of the fourth programming logic circuit 253_4, and an output signal of the eighth programming logic circuit 253_8. The fifth programming logic circuit 253_5 may generate a logic output signal (not shown) from the lookup table signal (not shown) stored therein, based on the logic input signal (not shown). The fifth programming logic circuit 253_5 may output the logic output signal (not shown) to at least one of the second programming logic circuit 253_2, the sixth programming logic circuit 253_6, and the eighth programming logic circuit 253_8.

The sixth programming logic circuit 253_6 may generate and store a lookup table signal (not shown), based on the seventh programming control signal CTR7. The sixth programming logic circuit 253_6 may receive a logic input signal (not shown) from at least one of the output signal of the third programming logic circuit 253_3, the output signal of the fifth programming logic circuit 253_5, and an output signal of the ninth programming logic circuit 253_9. The sixth programming logic circuit 253_6 may generate a logic output signal (not shown) from the lookup table signal (not shown) stored therein, based on the logic input signal (not shown). The sixth programming logic circuit 253_6 may output the logic output signal (not shown) to at least one of the third programming logic circuit 253_3, the ninth programming logic circuit 253_9, and the output multiplexing circuit 255.

The seventh programming logic circuit 253_7 may generate and store a lookup table signal (not shown), based on the eighth programming control signal CTR8. The seventh programming logic circuit 253_7 may receive a logic input signal (not shown) from at least one of the output signal of the input multiplexing circuit 251 and the output signal of the fourth programming logic circuit 253_4. The seventh programming logic circuit 253_7 may generate a logic output signal (not shown) from the lookup table signal (not shown) stored therein, based on the logic input signal (not shown). The seventh programming logic circuit 253_7 may output the logic output signal (not shown) to at least one of the fourth programming logic circuit 253_4 and the eighth programming logic circuit 253_8.

The eighth programming logic circuit 253_8 may generate and store a lookup table signal (not shown), based on the ninth programming control signal CTR9. The eighth programming logic circuit 253_8 may receive a logic input signal (not shown) from at least one of the output signal of the fifth programming logic circuit 253_5 and the output signal of the seventh programming logic circuit 253_7. The eighth programming logic circuit 253_8 may generate a logic output signal (not shown) from the lookup table signal (not shown) stored therein, based on the logic input signal (not shown). The eighth programming logic circuit 253_8 may output the logic output signal (not shown) to at least one of the fifth programming logic circuit 253_5 and the ninth programming logic circuit 253_9.

The ninth programming logic circuit 253_9 may generate and store a lookup table signal (not shown), based on the tenth programming control signal CTR10. The ninth programming logic circuit 253_9 may receive a logic input signal (not shown) from at least one of the output signal of the sixth programming logic circuit 253_6 and the output signal of the eighth programming logic circuit 253_8. The ninth programming logic circuit 253_9 may generate a logic output signal (not shown) from the lookup table signal (not shown) stored therein, based on the logic input signal (not shown). The ninth programming logic circuit 253_9 may output the logic output signal (not shown) to at least one of the sixth programming logic circuit 253_6 and the output multiplexing circuit 255.

The output multiplexing circuit 255 may output one of the output signal of the third programming logic circuit 253_3, the output signal of the sixth programming logic circuit 253_6, and the output signal of the ninth programming logic circuit 253_9 as one of a first programming command PCMD1, a second programming command PCMD2, a third programming command PCMD3, a programming row address PRAD, a programming column address PCAD, a programming row operation signal PRCNT, and a programming column operation signal PCCNT, based on the eleventh programming control signal CTR11.

Figure 8:
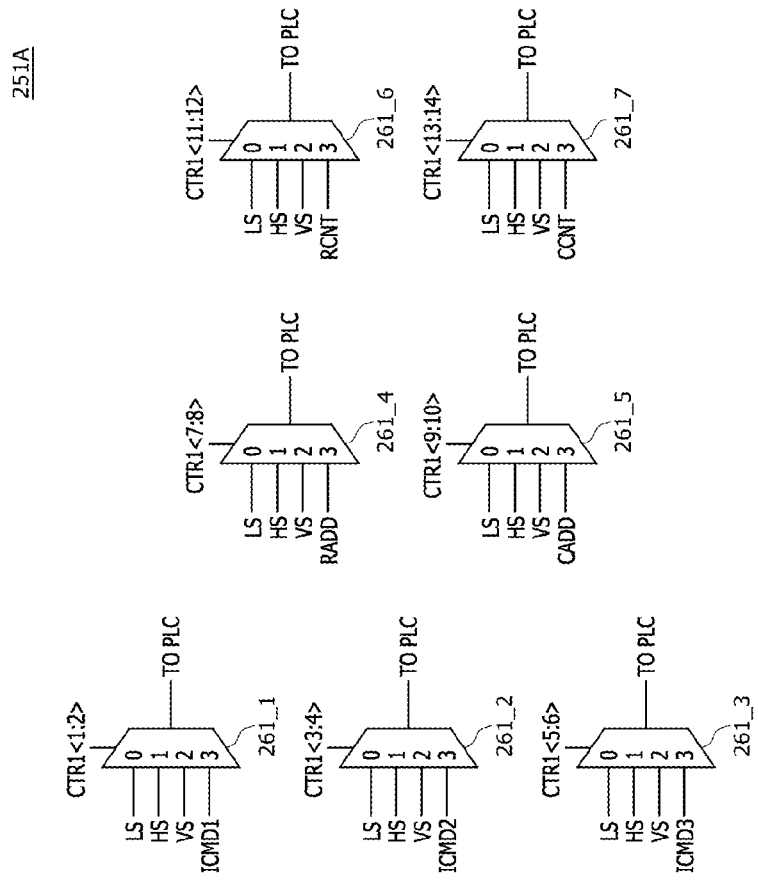
FIG. 8 is a circuit diagram illustrating an input multiplexing circuit according to an embodiment of the present disclosure.

FIG. 8 is a circuit diagram illustrating an input multiplexing circuit 251A according to an embodiment of the present disclosure. As illustrated in FIG. 8, the input multiplexing circuit 251A may include first to seventh input multiplexers 261_1~261_7.

The first input multiplexer 261_1 may select one of a first logic level signal LS, a second logic level signal HS, a variable level signal VS, and a first command ICMD1, based on first to second bits CTR1<1:2> of a first programming control signal CTR1 to output the selected one to one of the programming logic circuits PLC included in the programming control circuit (139A of FIG. 7).

The second input multiplexer 261_2 may select one of the first logic level signal LS, the second logic level signal HS, the variable level signal VS, and a second command ICMD2, based on third to fourth bits CTR1<3:4> of the first programming control signal CTR1 to output the selected one to one of the programming logic circuits PLC included in the programming control circuit (139A of FIG. 7).

The third input multiplexer 261_3 may select one of the first logic level signal LS, the second logic level signal HS, the variable level signal VS, and a third command ICMD3, based on fifth to sixth bits CTR1<5:6> of the first programming control signal CTR1 to output the selected one to one of the programming logic circuits PLC included in the programming control circuit (139A of FIG. 7).

The fourth input multiplexer 261_4 may select one of the first logic level signal LS, the second logic level signal HS, the variable level signal VS, and a row address RADD, based on seventh to eighth bits CTR1<7:8> of the first programming control signal CTR1 to output the selected one to one of the programming logic circuits PLC included in the programming control circuit (139A of FIG. 7).

The fifth input multiplexer 261_5 may select one of the first logic level signal LS, the second logic level signal HS, the variable level signal VS, and a column address CADD, based on ninth to tenth bits CTR1<9:10> of the first programming control signal CTR1 to output the selected one to one of the programming logic circuits PLC included in the programming control circuit (139A of FIG. 7).

The sixth input multiplexers 261_6 may select one of the first logic level signal LS, the second logic level signal HS, the variable level signal VS, and a row operation signal RCNT, based on eleventh to twelfth bits CTR1<11:12> of the first programming control signal CTR1 to output the selected one to one of the programming logic circuits PLC included in the programming control circuit (139A of FIG. 7).

The seventh input multiplexer 261_7 may select one of the first logic level signal LS, the second logic level signal HS, the variable level signal VS, and a column operation signal CCNT, based on thirteenth to fourteenth bits CTR1<13:14> of the first programming control signal CTR1 to output the selected one to one of the programming logic circuits PLC included in the programming control circuit (139A of FIG. 7).

Figure 9:
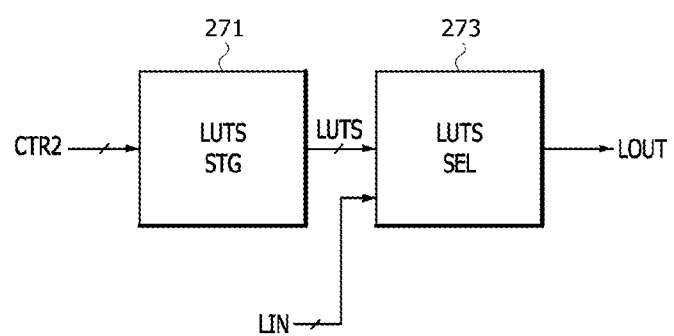
FIG. 9 is a block diagram illustrating a configuration of a programming logic circuit according to an embodiment of the present disclosure.

FIG. 9 is a block diagram illustrating a configuration of a programming logic circuit 253_1A according to an embodiment of the present disclosure. As illustrated in FIG. 9, the programming logic circuit 253_1A may include a lookup table signal storage circuit (LUTS STG) 271 and a lookup table signal selection circuit (LUTS SEL) 273.

The lookup table signal storage circuit 271 may generate and store a lookup table signal LUTS, based on a second programming control signal CTR2. The lookup table signal storage circuit 271 may generate and store a lookup table signal LUTS including a plurality of bits from the bits included in the second programming control signal CTR2. The lookup table signal storage circuit 271 may include a plurality of lookup table signal latches (LUTS LATs; 281_1, 281_2, 281_3, and 281_4 of FIG. 10) that store at least one bit. The at least one bit of the lookup table signal LUTS stored in each of the plurality of lookup table signal latches (281_1, 281_2, 281_3, and 281_4 of FIG. 10) included in the lookup table signal storage circuit 271 may be set to the result values of various logical operations for at least one bit of a logic input signal LIN. The lookup table signal storage circuit 271 may be connected to the lookup table signal selection circuit 273 to apply the lookup table signal LUTS to the lookup table signal selection circuit 273.

The lookup table signal selection circuit 273 may receive the lookup table signal LUTS from the lookup table signal storage circuit 271. The lookup table signal selection circuit 273 may be configured to receive the logic input signal LIN from at least one of the output signal of the input multiplexing circuit (251 of FIG. 7) and the output signal of the fourth programming logic circuit (253_4 of FIG. 7), but this is only an example, the present disclosure is not limited thereto. The lookup table signal selection circuit 273 may generate a logic output signal LOUT from the lookup table signal LUTS, based on the logic input signal LIN. The lookup table signal selection circuit 273 may select and output one of the bits included in the lookup table signal LUTS as the logic output signal LOUT according to a logic bit set of the bits included in the logic input signal LIN.

Figure 10:
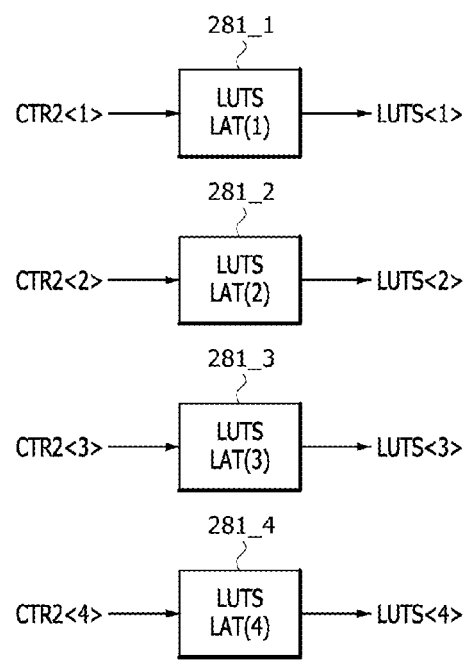
FIG. 10 is a block diagram illustrating a configuration of a lookup table signal storage circuit according to an embodiment of the present disclosure.

FIG. 10 is a block diagram illustrating a configuration of a lookup table signal storage circuit 271A according to an embodiment of the present disclosure. As illustrated in FIG. 10, the lookup table signal storage circuit 271A may include a first lookup table signal latch 281_1, a second lookup table signal latch 281_2, a third lookup table signal latch 281_3, and a fourth lookup table signal latch 281_4.

The first lookup table signal latch 281_1 may store a first bit CTR2<1> of a second programming control signal CTR2 and may output the first bit CTR2<1> of the second programming control signal CTR2 as a first bit LUTS<1> of a lookup table signal LUTS. The first bit LUTS<1> of the lookup table signal LUTS may be set to a result value of a first logical operation for at least one bit of the logic input signal LIN. The first logical operation may be set to one of an inversion operation, a buffering operation, a logical AND operation, a logical OR operation, a logical NAND operation, a logical NOR operation, an exclusive logical AND operation, and an exclusive logical OR operation.

The second lookup table signal latch 281_2 may store a second bit CTR2<2> of the second programming control signal CTR2 and may output the second bit CTR2<2> of the second programming control signal CTR2 as a second bit LUTS<2> of the lookup table signal LUTS. The second bit LUTS<2> of the lookup table signal LUTS may be set to a result value of a second logical operation for at least one bit of the logic input signal LIN. The second logical operation may be set to one of an inversion operation, a buffering operation, a logical AND operation, a logical OR operation, a logical NAND operation, a logical NOR operation, an exclusive logical AND operation, and an exclusive logical OR operation.

The third lookup table signal latch 281_3 may store a third bit CTR2<3> of the second programming control signal CTR2 and may output the third bit CTR2<3> of the second programming control signal CTR2 as a third bit LUTS<3> of the lookup table signal LUTS. The third bit LUTS<3> of the lookup table signal LUTS may be set to a result value of a third logical operation for at least one bit of the logic input signal LIN. The third logical operation may be set to one of an inversion operation, a buffering operation, a logical AND operation, a logical OR operation, a logical NAND operation, a logical NOR operation, an exclusive logical AND operation, and an exclusive logical OR operation.

The fourth lookup table signal latch 281_4 may store a fourth bit CTR2<4> of the second programming control signal CTR2 and may output the fourth bit CTR2<4> of the second programming control signal CTR2 as a fourth bit LUTS<4> of the lookup table signal LUTS. The fourth bit LUTS<4> of the lookup table signal LUTS may be set to a result value of a fourth logical operation for at least one bit of the logic input signal LIN. The fourth logical operation may be set to one of an inversion operation, a buffering operation, a logical AND operation, a logical OR operation, a logical NAND operation, a logical NOR operation, an exclusive logical AND operation, and an exclusive logical OR operation.

The lookup table signal storage circuit 271A may be configured to include various numbers of lookup table signal latches depending on the number of bits included in the logic input signal LIN. As an example, the lookup table signal storage circuit 271A may be configured to include 16 lookup table signal latches when the number of bits included in the logic input signal LIN is 4.

Figure 11:
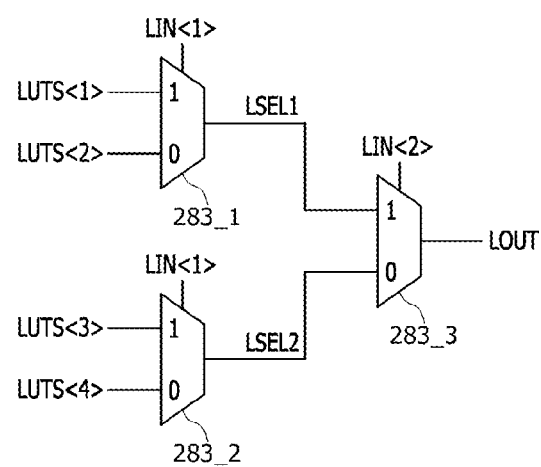
FIG. 11 is a circuit diagram illustrating a configuration of a lookup table signal selection circuit according to an embodiment of the present disclosure.

FIG. 11 is a circuit diagram illustrating a configuration of a lookup table signal selection circuit 273A according to an embodiment of the present disclosure. As illustrated in FIG. 11, the lookup table signal selection circuit 273A may include a first selector 283_1, a second selector 283_2, and a third selector 283_3.

The first selector 283_1 may select and output one of a first bit LUTS<1> of the lookup table signal LUTS and a second bit LUTS<2> of the lookup table signal LUTS, based on a first bit LIN<1> of a logic input signal LIN as a first logic selection signal LSEL1. The first selector 283_1 may select and output the first bit LUTS<1> of the lookup table signal LUTS as the first logic selection signal LSEL1 when the first bit LIN<1> of the logic input signal LIN is at a logic "high" level '1'. The first selector 283_1 may select and output the second bit LUTS<2> of the lookup table signal LUTS as the first logic selection signal LSEL1 when the first bit LIN<1> of the logic input signal LIN is at a logic "low" level '0'.

The second selector 283_2 may select and output one of a third bit LUTS<3> of the lookup table signal LUTS and a fourth bit LUTS<4> of the lookup table signal LUTS, based on the first bit LIN<1> of the logic input signal LIN as a second logic selection signal LSEL2. The second selector 283_2 may select and output the third bit LUTS<3> of the lookup table signal LUTS as the second logic selection signal LSEL2 when the first bit LIN<1> of the logic input signal LIN is at a logic "high" level '1'. The second selector 283_2 may select and output the fourth bit LUTS<4> of the lookup table signal LUTS as the second logic selection signal LSEL2 when the first bit LIN<1> of the logic input signal LIN is at a logic "low" level '0'.

The third selector 283_3 may select and output one of the first logic selection signal LSEL1 and the second logic selection signal LSEL2 as a logic output signal LOUT, based on the second bit LIN<2> of the logic input signal LIN. The third selector 283_3 may select and output the first logic selection signal LSEL1 as the logic output signal LOUT when the second bit LIN<2> of the logic input signal LIN is at a logic "high" level '1'. The third selector 283_3 may select and output the second logic selection signal LSEL2 as the logic output signal LOUT when the second bit LIN<2> of the logic input signal LIN is at a logic "low" level '0'.

The lookup table signal selection circuit 273A may select and output the first bit LUTS<1> of the lookup table signal LUTS as the logic output signal LOUT when the first bit LIN<1> of the logic input signal LIN and the second bit LIN<2> of the logic input signal LIN are both at a logic "high" level '1'. The lookup table signal selection circuit 273A may select and output the third bit LUTS<3> of the lookup table signal LUTS as the logic output signal LOUT when the first bit LIN<1> of the logic input signal LIN is at a logic "high" level '1' and the second bit LIN<2> of the logic input signal LIN is at a logic "low" level '0'. The lookup table signal selection circuit 273A may select and output the second bit LUTS<2> of the lookup table signal LUTS as the logic output signal LOUT when the first bit LIN<1> of the logic input signal LIN is at a logic "low" level '0' and the second bit LIN<2> of the logic input signal LIN is at a logic "high" level '1'. The lookup table signal selection circuit 273A may select and output the fourth bit LUTS<4> of the lookup table signal LUTS as the logic output signal LOUT when the first bit LIN<1> of the logic input signal LIN and the second bit LIN<2> of the logic input signal LIN are both at a logic "low" level '0'. The bits output from the lookup table signal selection circuit 273A as the logic output signal LOUT according to the logic bit set of the bits of the logic input signal LIN among the bits of the lookup table signal LUTS may vary according to embodiments.

Figure 12:
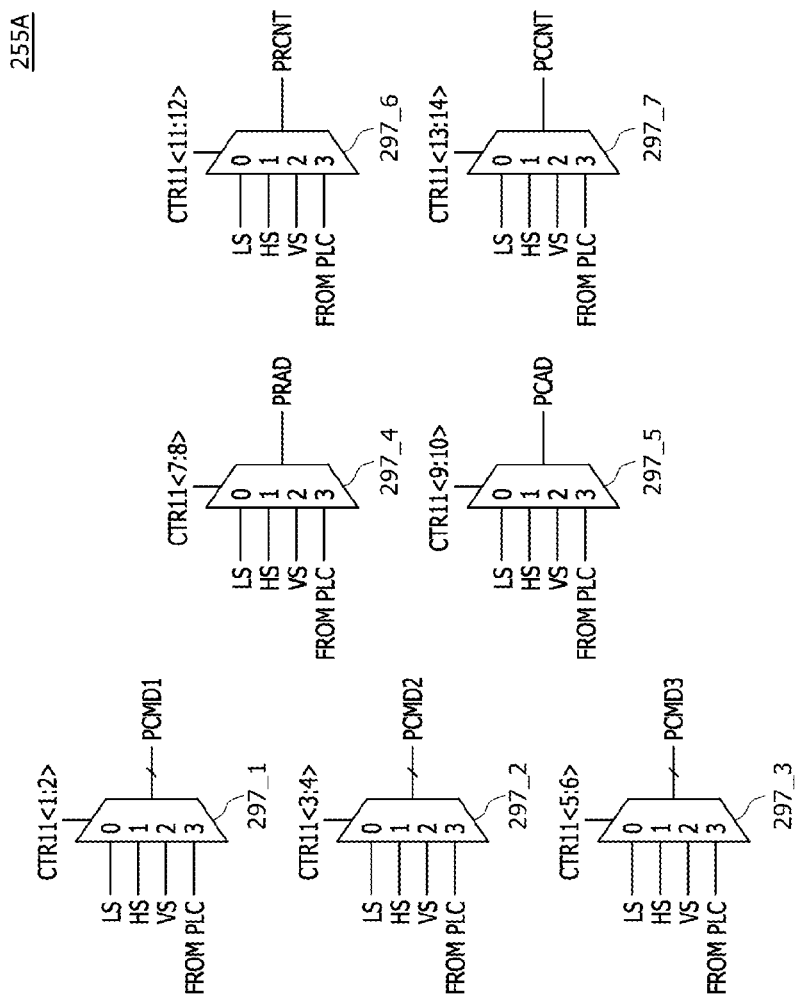
FIG. 12 is a circuit illustrating an output multiplexing circuit according to an embodiment of the present disclosure.

FIG. 12 is a circuit diagram illustrating an output multiplexing circuit 255A according to an embodiment of the present disclosure. As illustrated in FIG. 12, the output multiplexing circuit 255A may include first to seventh output multiplexers 297_1~297_7.

The first output multiplexer 297_1 may select one of a first logic level signal LS, a second logic level signal HS, a variable level signal VS, and output signals of programming logic circuits PLC, based on first to second bits CTR11<1:2> of an eleventh programming control signal CTR11, and output the selected one as a first programming command PCMD1.

The second output multiplexer 297_2 may select one of the first logic level signal LS, the second logic level signal HS, the variable level signal VS, and output signals of the programming logic circuits PLC, based on third to fourth bits CTR11<3:4> of the eleventh programming control signal CTR11 and output the selected one as a second programming command PCMD2.

The third output multiplexer 297_3 may select one of the first logic level signal LS, the second logic level signal HS, the variable level signal VS, and output signals of the programming logic circuits PLC, based on fifth to sixth bits CTR11<5:6> of the eleventh programming control signal CTR11 and output the selected one as a third programming command PCMD3.

The fourth output multiplexer 297_4 may select one of the first logic level signal LS, the second logic level signal HS, the variable level signal VS, and output signals of the programming logic circuits PLC, based on seventh to eighth bits CTR11<7:8> of the eleventh programming control signal CTR11 and output the selected one as a programming row address PRAD.

The fifth output multiplexer 297_5 may select one of the first logic level signal LS, the second logic level signal HS, the variable level signal VS, and output signals of the programming logic circuits PLC, based on ninth to tenth bits CTR11<9:10> of the eleventh programming control signal CTR11 and output the selected one as a programming column address PCAD.

The sixth output multiplexer 297_6 may select one of the first logic level signal LS, the second logic level signal HS, the variable level signal VS, and output signals of the programming logic circuits PLC, based on eleventh to twelfth bits CTR11<11:12> of the eleventh programming control signal CTR11 and output the selected one as a programming row operation signal PRCNT.

The seventh output multiplexer 297_7 may select one of the first logic level signal LS, the second logic level signal HS, the variable level signal VS, and output signals of the programming logic circuits PLC, based on thirteenth to fourteenth bits CTR11<13:14> of the eleventh programming control signal CTR11 and output the selected one as a programming column operation signal PCCNT.

Figure 13:
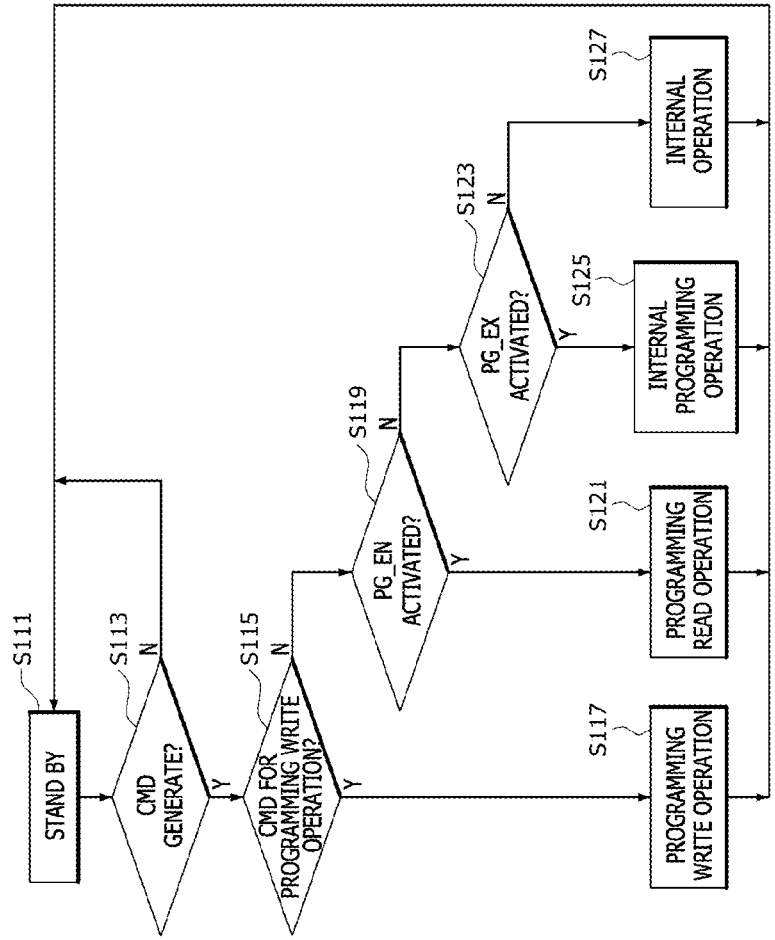
FIG. 13 is a timing diagram illustrating a programming operation according to an embodiment of the present disclosure.

FIG. 13 is a timing diagram illustrating a programming operation according to an embodiment of the present disclosure.

If a command (CMD) is not generated based on an external control signal (CA in FIG. 2), a semiconductor device (13A in FIG. 2) may maintain the standby state (S111). If a command is generated based on the external control signal (CA in FIG. 2) (S113), the semiconductor device (13A in FIG. 2) may determine whether the command is for a programming write operation (S115). If the command for a programming write operation is input, the programming write operation may be performed in which input data (DIN in FIG. 2) is stored as programming data PDATA in a memory block (131 in FIG. 2) (S117).

If it is determined that a programming enable signal PG_EN is activated (S119) and a command for a programming read operation is generated based on the external control signal (CA in FIG. 2), the programming read operation of generating programming commands (PCMD1, PCMD2, and PCMD3 in FIG. 2), programming addresses (PRAD and PCAD in FIG. 2), and programming operation signals (PRCNT and PCCNT in FIG. 2) may be performed, based on the programming data PDATA stored in the memory block (131 in FIG. 2) (S121).

If the programming read operation is performed and a programming termination signal (PG_EX of FIG. 2) is activated (S123), an internal programming operation may be performed by the programming commands (PCMD1, PCMD2, and PCMD3 of FIG. 2), the programming addresses (PRAD and PCAD of FIG. 2), and the programming operation signals (PRCNT and PCCNT of FIG. 2) which are generated in the programming read operation (S125).

Meanwhile, if it is determined that the programming enable signal PG_EN is in a deactivated state (S119) and it is determined that the programming termination signal (PG_EX in FIG. 2) is in a deactivated state (S123), an internal operation may be performed by the commands (ICMD, ICMD2 and ICMD3 in FIG. 2), the addresses (IRAD and ICAD in FIG. 2), and the control signals (RCNT and CCNT in FIG. 2) (S127).

Figure 14:
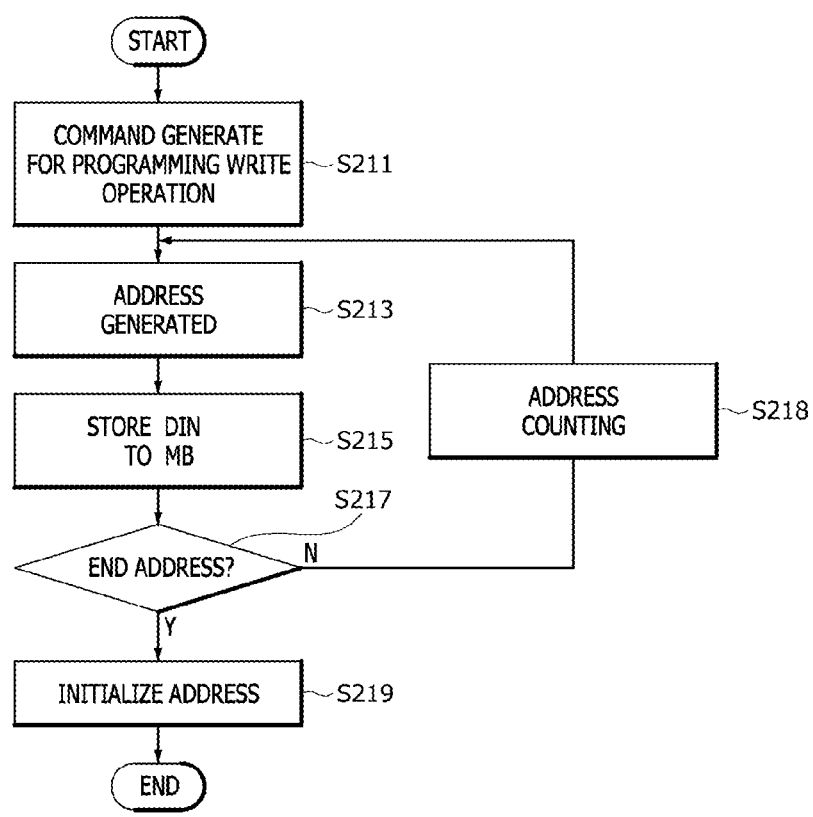
FIG. 14 is a timing diagram illustrating a programming write operation according to an embodiment of the present disclosure.

FIG. 14 is a timing diagram illustrating a programming write operation according to an embodiment of the present disclosure. If a command for a programming write operation is generated based on an external control signal (CA in FIG. 2) (S211), an address for the programming write operation may be generated (S213), and input data (DIN in FIG. 2) may be stored as programming data PDATA in a memory block MB accessed by the generated address (S215). If it is determined whether the address on which the programming write operation is performed is the last address (S217) and the programming write operation is not performed on the last address (N), the address may be counted (S218), and programming write operations for the counted address may be repeatedly performed (S213~S215). Meanwhile, if the programming write operation for the last address is performed (Y), the address may be initialized (S219), and the programming write operation may be terminated.

Figure 15:
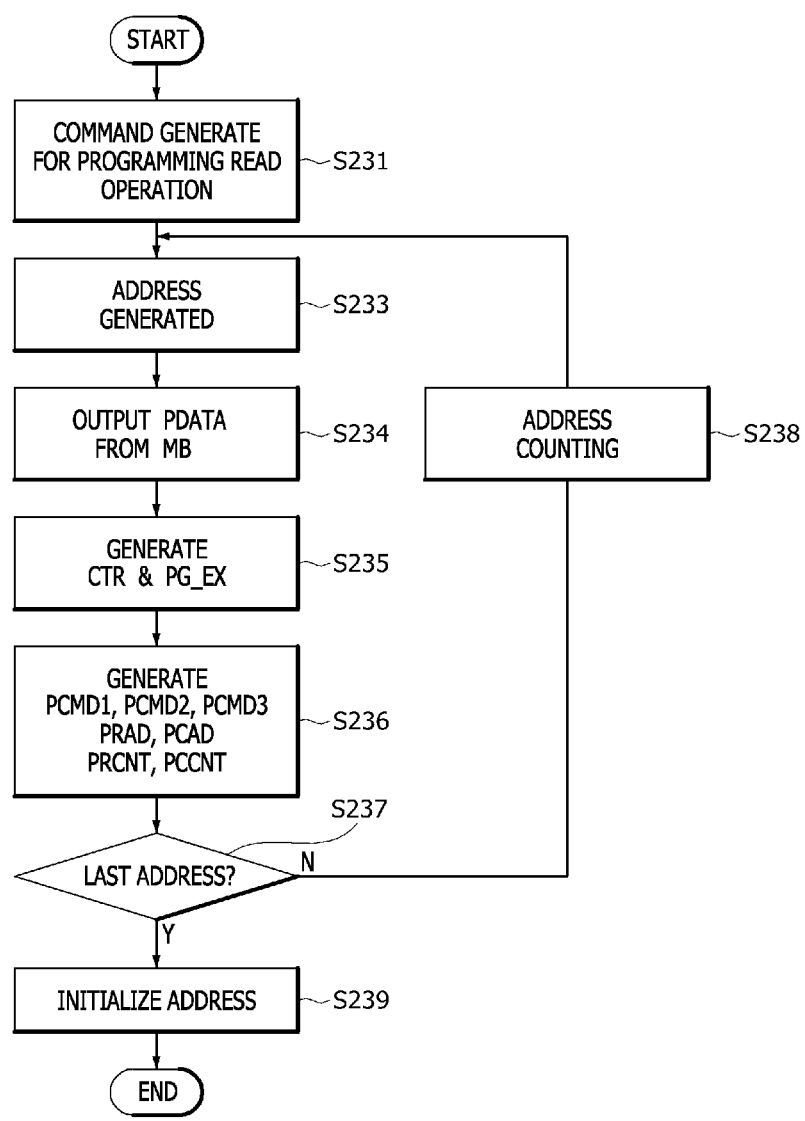
FIG. 15 is a timing diagram illustrating a programming read operation according to an embodiment of the present disclosure.

FIG. 15 is a timing diagram illustrating a programming read operation according to an embodiment of the present disclosure. If a command for the programming read operation is generated based on the external control signal (CA in FIG. 2) (S231), an address for the programming read operation may be generated (S233), and programming data PDATA stored in the memory block MB accessed by the generated address may be output (S234). A programming control signal CTR and a programming termination signal PG_EX may be generated by the programming data PDATA (S235), and programming commands (PCMD1, PCMD2, and PCMD3 in FIG. 2), programming addresses (PRAD and PCAD in FIG. 2), and programming operation signals (PRCNT and PCCNT of FIG. 2) may be generated (S236) based on the programming control signal CTR. It may be determined whether the address is the last address (S237), and if the programming read operation for the last address is not performed (N), the address may be counted (S238), and the programming read operations for the counted address may be repeatedly performed (S233~S236). Meanwhile, if the programming read operation for the last address is performed (Y), the address may be initialized (S239), and the programming read operation may be terminated.

Figure 16:
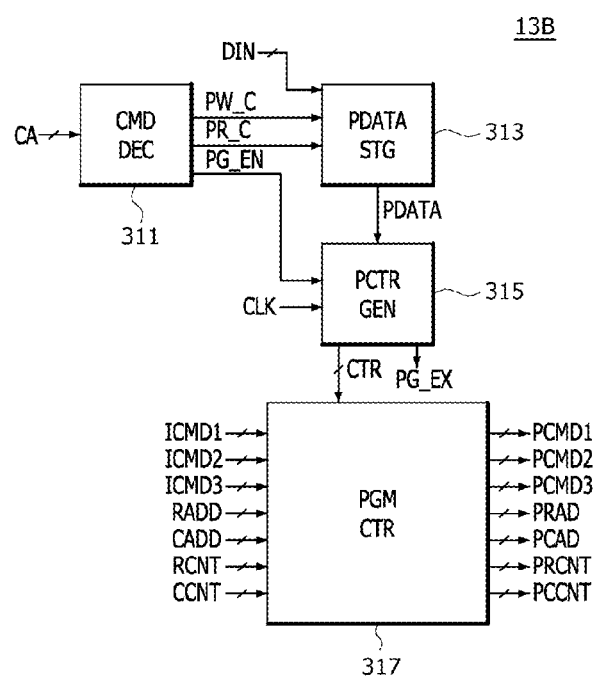
FIG. 16 is a block diagram illustrating a configuration of a semiconductor device according to another embodiment of the present disclosure.

FIG. 16 is a block diagram illustrating a configuration of a semiconductor device 13B according to another embodiment of the present disclosure. As illustrated in FIG. 16, the semiconductor device 13B may include a command decoder (CMD DEC) 311, a programming data storage circuit (PDATA STG) 313, a programming control signal generation circuit (PCTR GEN) 315, and a programming control circuit (PGM CTR) 317.

The command decoder 311 may decode an external control signal CA to generate a programming write command PW_C, a programming read command PR_C, and a programming enable signal PG_EN. The programming write command PW_C may be generated for a programming write operation. The programming read command PR_C may be generated for a programming read operation. The programming enable signal PG_EN may be generated for a programming operation.

The programming data storage circuit 313 may be connected to the command decoder 311 and the programming control signal generation circuit 315. The programming data storage circuit 313 may receive the programming write command PW_C and the programming read command PR_C from the command decoder 311. The programming data storage circuit 313 may store input data DIN as the programming data PDATA, based on the programming write command PW_C. The programming data storage circuit 313 may output the stored programming data PDATA, based on the programming read command PR_C. The programming data storage circuit 313 may apply the programming data PDATA to the programming control signal generation circuit 315. The programming data storage circuit 313 may be implemented with a memory block (MB of FIG. 2), but may be implemented with a storage device distinct from the memory block (MB in FIG. 2) according to an embodiment, for example, a data latch or a register.

The programming control signal generation circuit 315 may be connected to the command decoder 311 and the programming data storage circuit 313. The programming control signal generation circuit 315 may receive the programming enable signal PG_EN from the command decoder 311. The programming control signal generation circuit 315 may receive the programming data PDATA from the programming data storage circuit 313. When a programming operation is performed and an activated programming enable signal PG_EN is received, the programming control signal generation circuit 315 may generate a programming control signal CTR and a programming termination signal PG_EX, based on a clock CLK and the programming data PDATA. The programming termination signal PG_EX may be activated when the programming operation in which the programming control signal CTR is generated from the programming data PDATA is terminated. The programming control signal generation circuit 315 may be connected to the programming control circuit 317. The programming control signal generation circuit 315 may apply the programming control signal CTR to the programming control circuit 317.

The programming control circuit 317 may be connected to the programming control signal generation circuit 315. The programming control circuit 317 may receive the programming control signal CTR from the programming control signal generation circuit 315. When a programming operation is performed, the programming control circuit 317 may generate a first programming command PCMD1, a second programming command PCMD2, a third programming command PCMD3, a programming row address PRAD, a programming column address PCAD, a programming row operation signal PRCNT, and a programming column operation signal PCCNT from a first command ICMD1, a second command ICMD2, a third command ICMD3, a row address RADD, a column address CADD, a row operation signal RCNT, and a column operation signal CCNT, based on the programming control signal CTR.

Figure 17:
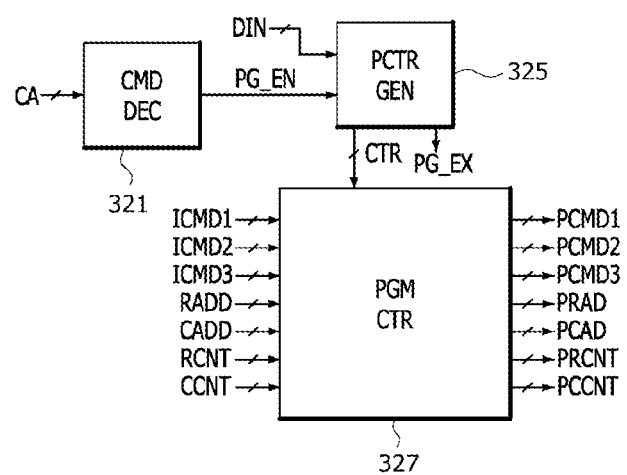
FIG. 17 is a block diagram illustrating a configuration of a semiconductor device according to yet another embodiment of the present disclosure.

FIG. 17 is a block diagram illustrating a configuration of a semiconductor device 13C according to yet another embodiment of the present disclosure. As illustrated in FIG. 17, the semiconductor device 13C may include a command decoder (CMD DEC) 321, a programming control signal generation circuit (PCTR GEN) 325, and a programming control circuit (PGM CTR) 327.

The command decoder 321 may decode an external control signal CA to generate a programming enable signal PG_EN. The programming enable signal PG_EN may be generated for a programming operation.

The programming control signal generation circuit 325 may be connected to the command decoder 321. The programming control signal generation circuit 325 may receive the programming enable signal PG_EN from the command decoder 321. The programming control signal generation circuit 325 may receive input data DIN when a programming operation is performed and an activated programming enable signal PG_EN is received, and may generate a programming control signal CTR and a programming termination signal PG_EX, based on the input data DIN. The programming control signal generation circuit 325 may be connected to the programming control circuit 327. The programming control signal generation circuit 325 may apply the programming control signal CTR to the programming control circuit 327.

The programming control circuit 327 may be connected to the programming control signal generation circuit 325. The programming control circuit 327 may receive the programming control signal CTR from the programming control signal generation circuit 325. When a programming operation is performed, the programming control circuit 327 may generate a first programming command PCMD1, a second programming command PCMD2, a third programming command PCMD3, a programming row address PRAD, a programming column address PCAD, a programming row operation signal PRCNT, and a programming column operation signal PCCNT from a first command ICMD1, a second command ICMD2, a third command ICMD3, a row address RADD, a column address CADD, a row operation signal RCNT, and a column operation signal CCNT, based on the programming control signal CTR.

In an embodiment, the semiconductor devices 13A, 13B, and 13C configured as described above program the commands ICMD1, ICMD2, and ICMD3, the programming addresses PRAD and PCAD, and the programming operation signals PRCNT and PCCNT to use the programmed commands, addresses, and signals for internal operations of the semiconductor devices, so that it is possible to easily cope with a change in the specification of a semiconductor device without revising internal circuits, which consumes time and cost.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a programming control signal generation circuit configured to generate a programming control signal and a programming termination signal based on programming data when a programming operation is performed; and
   a programming control circuit configured to program a command, an address, and an operation signal, based on the programming control signal to generate a programming command, a programming address, and a programming operation signal,
   wherein the programming control circuit further includes a plurality of programming logic circuits that store result values of logical operations as lookup table signals, based on the programming control signal.

2. The semiconductor device of claim 1, wherein the programming control signal generation circuit receives a programming enable signal that is activated when the programming operation is performed.

3. The semiconductor device of claim 2, further comprising a mode register that:
   extracts and stores the programming enable signal from an external control signal when a mode register write operation is performed; and
   outputs the programming enable signal to the programming control signal generation circuit when a mode register read operation is performed.

4. The semiconductor device of claim 1,
   wherein the programming control signal includes first and second programming control signals, and
   wherein the programming control signal generation circuit includes:
   a first programming control signal generation circuit configured to generate the first programming control signal, based on a clock; and
   a second programming control signal generation circuit configured to generate the second programming control signal, based on the clock.

5. The semiconductor device of claim 4, wherein the clock is applied from outside of the semiconductor device or is generated inside the semiconductor device.

6. The semiconductor device of claim 4, wherein the first programming control signal generation circuit sequentially latches the programming data in synchronization with the clock to generate bits included in the first programming control signal when the programming operation is performed.

7. The semiconductor device of claim 6, wherein the second programming control signal generation circuit sequentially latches output signals of the first programming control signal generation circuit in synchronization with the clock to generate bits included in the second programming control signal when the programming operation is performed.

8. The semiconductor device of claim 7, wherein the second programming control signal generation circuit latches the last bit included in the second programming control signal in synchronization with the clock to generate the programming termination signal.

9. The semiconductor device of claim 1,
   wherein the command includes first to third commands, and
   wherein the first command is generated for a row operation, the second command is generated for a column operation, and the third command is generated for a mode register write operation and a mode register read operation.

10. The semiconductor device of claim 1,
    wherein the address includes a row address and column address,
    wherein the row address is generated for selecting at least one of word lines to which cell arrays are connected, when a row operation is performed, and
    wherein the column address is generated for selecting at least one of bit lines to which the cell arrays are connected, when a column operation is performed.

11. The semiconductor device of claim 1,
    wherein the operation signal includes a row operation signal and a column operation signal,
    wherein the row operation signal is generated for controlling a row operation, and
    wherein the column operation signal is generated for controlling a column operation.

12. The semiconductor device of claim 1, wherein the programming control circuit includes an input multiplexing circuit that receives at least one of the command, the address, the operation signal, and level signals, based on the programming control signal.

13. The semiconductor device of claim 12,
    wherein each of the plurality of programming logic circuits generates a logic output signal from the lookup table signals, based on a logic input signal received from at least one of a signal input from the input multiplexing circuit and output signals of the plurality of programming logic circuits.

14. The semiconductor device of claim 13, wherein the programming control circuit further includes an output multiplexing circuit that selects and outputs one of the output signals of the plurality of programming logic circuits and the level signals as one of the programming command, the programming address, and the programming operation signal, based on the programming control signal.

15. The semiconductor device of claim 1, further comprising:
    a command multiplexing circuit configured to generate a selection command from the command and the programming command, based on the programming termination signal;

an address multiplexing circuit configured to generate a selection address from the address and the programming address, based on the programming termination signal; and an operation signal multiplexing circuit configured to generate a selection operation signal from the operation signal and the programming operation signal, based on the programming termination signal.

16. A semiconductor device comprising:

a programming control signal generation circuit configured to generate a programming control signal and a programming termination signal based on input data when a programming operation is performed; and a programming control circuit configured to program a command, an address, and an operation signal, based on the programming control signal to generate a programming command, a programming address, and a programming operation signal, wherein the programming control circuit further includes a plurality of programming logic circuits that store result values of logical operations as lookup table signals, based on the programming control signal.

17. A method of performing a programming operation, the method comprising:

performing a programming write operation of storing input data in a memory block as programming data when the programming operation is performed; and performing a programming read operation of generating a programming control signal and a programming termination signal, based on the programming data stored in the memory block, storing result values of logical operations as lookup table signals, based on the programming control signal, and programming a command, an address, and an operation signal, based on the programming control signal to generate a programming command, a programming address, and a programming operation signal.

18. The method of claim 17, wherein performing the programming write operation comprises:

generating the address, based on the command for the programming write operation;

storing the input data as the programming data in the memory block accessed by the address; and performing one of counting the address and initializing the address according to whether the address is a last address.

19. The method of claim 17, wherein performing the programming read operation comprises:

generating the address, based on the command for the programming read operation;

generating the programming control signal from the programming data stored in the memory block accessed by the address; and generating the programming command, the programming address, and the programming operation signal, based on the programming control signal.

20. The method of claim 17, further comprising:

generating a selection command from the command and the programming command, based on the programming termination signal;

generating a selection address from the address and the programming address, based on the programming termination signal; and generating a selection operation signal from the operation signal and the programming operation signal, based on the programming termination signal.

21. A semiconductor device comprising:

a programming data storage circuit configured to store input data as programming data, based on a programming write command and output the stored programming data, based on a programming read command;

a programming control signal generation circuit configured to generate a programming control signal and a programming termination signal from the programming data when a programming operation is performed; and a programming control circuit configured to program a command, an address, and an operation signal, based on the programming control signal to generate a programming command, a programming address, and a programming operation signal, wherein the programming control circuit further includes a plurality of programming logic circuits that store result values of logical operations as lookup table signals, based on the programming control signal.

22. The semiconductor device of claim 21, wherein the programming data storage circuit comprises at least one of a memory block, a data latch, and a register.

* * * * *